US009912296B1

(12) United States Patent
Cheng et al.

(10) Patent No.: US 9,912,296 B1
(45) Date of Patent: Mar. 6, 2018

(54) HIGH LOOP-GAIN PHEMT REGULATOR FOR LINEAR RF POWER AMPLIFIER

(71) Applicant: Qorvo US, Inc., Greensboro, NC (US)

(72) Inventors: Peng Cheng, Greensboro, NC (US); Swaminathan Muthukrishnan, Waltham, MA (US); David Antopolsky, Sandy Springs, GA (US); Jeremiah J. Smith, Richland, MI (US); Nancy Schaefer, Ashland, MA (US); Randy Naylor, Pepperell, MA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/600,866

(22) Filed: May 22, 2017

Related U.S. Application Data

(60) Provisional application No. 62/377,966, filed on Aug. 22, 2016.

(51) Int. Cl.

| H04B 1/16 | (2006.01) |
|---|---|
| H03F 1/02 | (2006.01) |
| H03F 3/195 | (2006.01) |
| H03F 3/24 | (2006.01) |
| H03F 3/72 | (2006.01) |
| H03G 3/00 | (2006.01) |
| H03G 3/30 | (2006.01) |

(52) U.S. Cl.
CPC ........... *H03F 1/0216* (2013.01); *H03F 3/195* (2013.01); *H03F 3/245* (2013.01); *H03F 3/72* (2013.01); *H03G 3/004* (2013.01); *H03G 3/3042* (2013.01)

(58) Field of Classification Search
CPC ...... H03F 1/0216; H03F 1/0211; H03F 3/195; H03F 3/245; H03F 3/72; H03G 3/004; H03G 3/3042
USPC ............ 455/127.1, 195.1, 262, 264; 327/540
See application file for complete search history.

(56) References Cited

U.S. PATENT DOCUMENTS

| 7,259,623 | B2 * | 8/2007 | Coleman | ............... | H01L 23/473 315/209 R |
|---|---|---|---|---|---|
| 7,307,475 | B2 * | 12/2007 | Coleman | ............... | H01L 23/473 330/146 |
| 7,948,305 | B2 * | 5/2011 | Shirokov | .................. | G05F 1/56 323/315 |

(Continued)

OTHER PUBLICATIONS

Apel, Thomas et al., "Efficient Three-State WCDMA PA Integrated with High-Performance BiHEMT HBT / E-D pHEMT Process," IEEE Radio Frequency Integrated Circuits (RFIC) Symposium, Jun. 15-17, 2008, Atlanta, GA, USA, IEEE, pp. 149-152.

(Continued)

*Primary Examiner* — Sonny Trinh
(74) *Attorney, Agent, or Firm* — Withrow & Terranova, P.L.L.C.

(57) ABSTRACT

Voltage regulator circuitry includes a first gain stage, a second gain stage, and a feedback stage. Feedback is provided between the feedback stage, the second gain stage, and the first gain stage in order to tightly regulate an output voltage of the voltage regulator circuitry such that the output voltage is independent of process variations present in the devices therein. The voltage regulator circuitry is fabricated using a pseudomorphic high electron mobility transistor (pHEMT) process in order to reduce the size thereof and provide short turn-on times and low quiescent current.

20 Claims, 3 Drawing Sheets

(56) References Cited

U.S. PATENT DOCUMENTS

| | | | | |
|---|---|---|---|---|
| 8,472,887 B2* | 6/2013 | Penn | ......................... | H04B 1/40 455/73 |
| 9,280,169 B2* | 3/2016 | Bouwman | ................. | G05F 3/16 |
| 9,791,480 B2* | 10/2017 | Qin | .................... | G01R 19/0092 |

OTHER PUBLICATIONS

Author Unknown, "NCP717: 300 mA, Very-Low Quiescent Current, IQ 25 μA, Low Noise, Low Dropout Regulator," Data Sheet, Revision 8, Nov. 2015, Semiconductor Components Industries, LLC., pp. 1-16.

Author Unknown, "QM48184: 2.4 & 5 GHz WiFi Front End Module," Preliminary Data Sheet, Sep. 9, 2016, Qorvo, Inc., pp. 1-21.

Author Unknown, "QPF8248: Wi-Fi Front End Module," Data Sheet, Revision C, Dec. 19, 2016, Qorvo, Inc., p. 1-7.

Author Unknown, "RFFM4251: Wi-Fi Front End Module," Data Sheet, Nov. 30, 2016, Qorvo, Inc. pp. 1-7.

Author Unknown, "RFFM4252: Wi-Fi Front End Module," Data Sheet, Nov. 30, 2016, Qorvo, Inc., pp. 1-7.

Author Unknown, "RFFM8216: 2.4 GHz Integrated Wi-Fi Front-End Module," Data Sheet, Date Unknown, accessed Oct. 4, 2017, Qorvo, Inc. pp. 1-11.

Bryant, James et al, "Chapter 1: Op Amp Basics," In Jung, Walt, eds., "Op Amp Applications Handbook," 2005, Newnes, Analog Devices, Inc., 126 pages.

El Khadiri, Karim et al., "A low noise, high PSR low-dropout regulator for low-cost portable electronics," ACS International Conference on Computer Systems and Applications (AICCSA), May 27-30, 2013, Ifrane, Morocco, IEEE, 5 pages.

Lin, Chia-Hsiang et al., "Low-Dropout Regulators With Adaptive Reference Control and Dynamic Push—Pull Techniques for Enhancing Transient Performance," IEEE Transactions on Power Electronics, vol. 24, Issue 4, Apr. 2009, IEEE, pp. 1016-1022.

Yamamoto, Kazuya et al., "A CDMA InGaP/GaAs-HBT MMIC Power Amplifier Module Operating With a Low Reference Voltage of 2.4 V," IEEE Journal of Solid-State Circuits, vol. 42, Issue 6, Jun. 2007, IEEE, pp. 1282-1290.

* cited by examiner

HIGH LOOP-GAIN PHEMT REGULATOR FOR LINEAR RF POWER AMPLIFIER

RELATED APPLICATIONS

This application claims the benefit of provisional patent application Ser. No. 62/377,966, filed Aug. 22, 2016, the disclosure of which is hereby incorporated herein by reference in its entirety.

FIELD OF THE DISCLOSURE

The present disclosure relates to voltage regulator circuitry, and specifically to voltage regulator circuitry for radio frequency (RF) power amplifiers.

BACKGROUND

Modern radio frequency (RF) systems generally require highly linear RF power amplifiers in order to properly transmit signals. To provide high linearity, RF power from an RF power amplifier must remain constant over the entirety of a data frame despite changes in duty cycle, ambient temperature, and supply voltage. Maintaining a constant RF power generally requires a tightly controlled bias signal to be provided to the RF power amplifier, which may be difficult due to the dynamic signal environments in which modern RF systems exist. Maintaining tight control over the bias signal will generally reduce the error vector magnitude and other metrics of linearity such as amplitude modulation AM to AM distortion of the RF power amplifier and therefore allow the amplifier to meet the stringent specifications of modern wireless communications standards such as WiFi.

A power amplifier voltage regulator is generally responsible for providing a bias signal to a power amplifier. As discussed above, it is desirable for a power amplifier voltage regulator to provide a highly stable bias signal that is not affected by process variation of one or more components therein. Further, it is desirable for a power amplifier voltage regulator to maintain a temperature slope that is suited for the bias circuits of the power amplifier with which it is used, achieve very short turn-on time such that the power amplifier is able to accurately amplify preambles of data frames, have a small size, and consume a low quiescent current to reduce battery drain (e.g., less than 0.5 µA). Generally, it is very difficult to design a power amplifier voltage regulator that meets all of these criteria.

FIG. 1 is a functional schematic illustrating an idealized power amplifier voltage regulator 10. The idealized power amplifier voltage regulator 10 includes an operational amplifier 12, a first feedback resistor $R_F$, and a second feedback resistor $R_G$. The operational amplifier 12 includes a power supply voltage node $N_{VPS}$, a non-inverting input node $N_{NI}$, an inverting input node $N_I$, and an output node $N_{REG}$. A power supply voltage $V_{PS}$ is provided to the power supply voltage node $N_{VPS}$. An input voltage $V_{IN}$ is provided to the non-inverting input node $N_{NI}$, and may be equal to the power supply voltage $V_{PS}$. A regulated output voltage $V_{REG}$ is provided at the output node $N_{REG}$. The inverting input node $N_I$ is coupled to the junction between the first feedback resistor $R_F$ and the second feedback resistor $R_G$ and thus receives a feedback signal therefrom. Given the feedback structure of the idealized power amplifier voltage regulator 10, the gain of the device can be expressed by Equation (1):

$$G = \frac{V_{REG}}{V_{IN}} = 1 + \left(\frac{R_F}{R_G}\right) \quad (1)$$

Those skilled in the art will appreciate that the operational amplifier 12 will attempt to equalize the voltage at the non-inverting input node $N_{NI}$ and the inverting input node $N_I$ via the feedback formed between the output node $N_{REG}$ and the inverting input node $N_I$. The feedback provided at the inverting input node $N_I$ effectively ensures that the regulated output voltage $V_{REG}$ is tightly controlled regardless of process variations inherent in the operational amplifier 12 and tracks ambient temperature. If the operational amplifier 12 acts ideally, then it will also provide short turn-on times and relatively low quiescent current consumption.

Implementing the idealized voltage regulator circuitry in a mobile device is a challenging task. Generally, standard operational amplifiers are created via CMOS processes and are too large for mobile applications. Accordingly, there is a need for voltage regulator circuitry for a mobile device with a small footprint that provides a tightly controlled output voltage that tracks ambient temperature, short turn-on times, and low quiescent current consumption.

SUMMARY

The present disclosure relates to voltage regulator circuitry, and specifically to voltage regulator circuitry for linear radio frequency (RF) power amplifiers. In one embodiment, voltage regulator circuitry includes a first gain stage, a second gain stage, and a feedback stage. The first gain stage includes a first transistor with a gate contact, a drain contact coupled to a supply voltage node, and a source contact coupled to a regulated output voltage node and to the gate contact via a current setting resistor and a second transistor with a gate contact, a drain contact coupled to the gate contact of the first transistor, and a source contact coupled to a ground node. The second gain stage includes a third transistor with a gate contact, a drain contact coupled to the gate contact of the second transistor, and a source contact coupled to the ground node and a number of stacked gain stage diodes coupled in series between the regulated output voltage node and the drain contact of the third transistor such that an anode of a first one of the stacked gain stage diodes is coupled to the regulated output voltage node and a cathode of a last one of the stacked gain stage diodes is coupled to the drain contact of the third transistor. The feedback stage includes a feedback resistor coupled between the gate contact of the third transistor and the ground node and a number of stacked feedback diodes coupled between the regulated output voltage node and the feedback resistor such that an anode of a first one of the stacked feedback diodes is coupled to the regulated output voltage node and a cathode of a last one of the stacked feedback diodes is coupled to the feedback resistor. Providing the voltage regulator circuitry in this manner reduces the dependency of a regulated output voltage provided therefrom on process variations that may occur in the components of the circuitry.

In one embodiment, the first transistor, the second transistor, and the third transistor are pseudomorphic high electron mobility transistors (pHEMTs). Accordingly, the voltage regulator circuitry may have a small footprint while providing short turn-on times and low quiescent current consumption.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
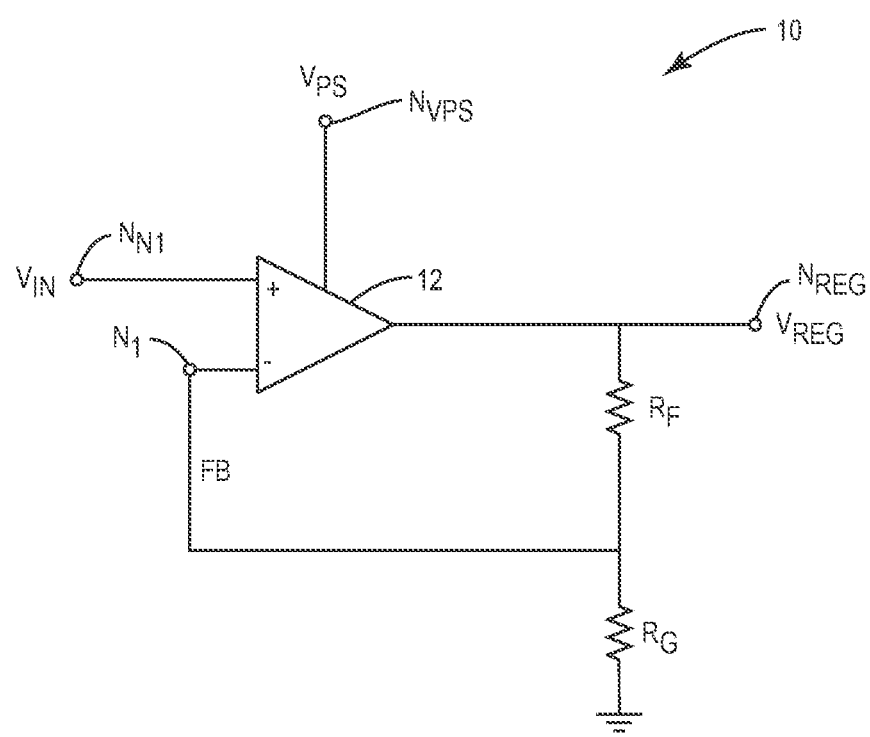
FIG. 1 is a functional schematic illustrating an idealized voltage regulator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
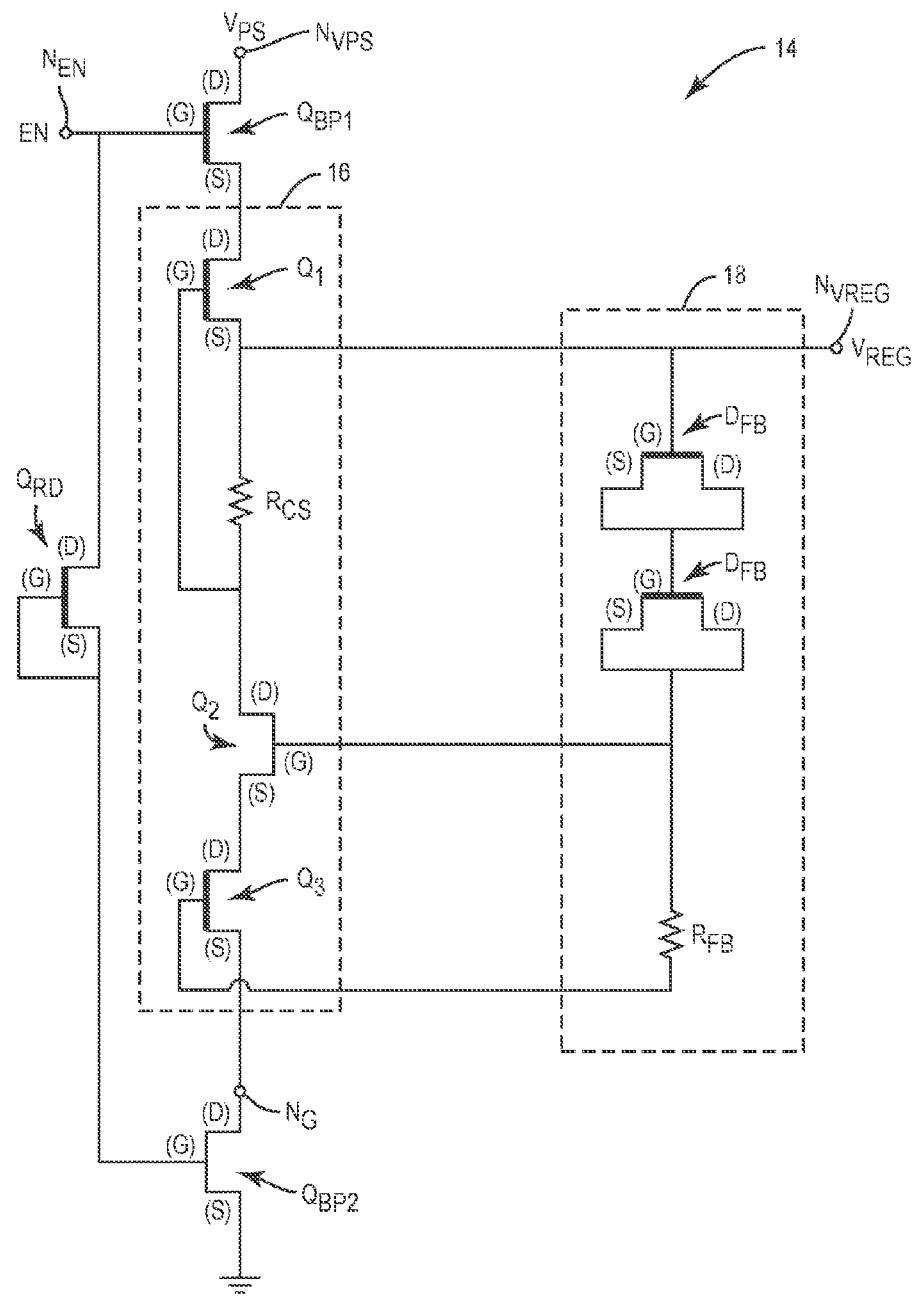
FIG. 2 is a functional schematic illustrating voltage regulator circuitry according to one embodiment of the present disclosure.

FIG. 2 shows voltage regulator circuitry 14 according to one embodiment of the present disclosure. The voltage regulator circuitry 14 includes a gain stage 16 and a feedback stage 18. The gain stage 16 includes a first transistor $Q_1$, a current setting resistor $R_{CS}$, a second transistor $Q2$, and a third transistor $Q_3$. The first transistor $Q_1$ includes a gate contact (G), a drain contact (D) coupled to a power supply voltage node $N_{VPS}$, and a source contact (S) coupled to the gate contact (G) via the current setting resistor $R_{CS}$ and coupled to a regulated output voltage node $N_{VREG}$. The second transistor $Q_2$ includes a gate contact (G), a drain contact (D) coupled to the source contact (S) of the first transistor $Q_1$, and a source contact (S). The third transistor $Q_3$ includes a gate contact (G), a drain contact (D) coupled to the source contact (S) of the second transistor $Q_2$, and a source contact coupled to a ground node $N_G$.

A first bypass transistor $Q_{BP1}$ may be coupled between a power supply voltage $V_{PS}$ and the power supply voltage node $N_{VPS}$. Specifically, a drain contact (D) of the first bypass transistor $Q_{BP1}$ may receive the power supply voltage $V_{PS}$ and a source contact (S) may be coupled to the power supply voltage node $N_{VPS}$. A gate contact (G) of the first bypass transistor $Q_{BP1}$ may be coupled to an enable signal node $N_{EN}$. A second bypass transistor $Q_{BP2}$ may be coupled between the ground node $N_G$ and a fixed potential (e.g., ground). Specifically, a drain contact (D) of the second bypass transistor $Q_{BP2}$ may be coupled to the ground node $N_G$ and a source contact (S) may be coupled to a fixed potential (e.g., ground). A gate contact (G) of the second bypass transistor $Q_{BP2}$ may be coupled to the enable signal node $N_{EN}$ via a reverse diode connected transistor $Q_{RD}$, which is configured to limit the turn-on gate current provided from the enable signal node $N_{EN}$ to the second bypass transistor $Q_{BP2}$. The reverse diode connected transistor $Q_{RD}$ may include a gate contact (G), a drain contact (D) coupled to the enable signal node $N_{EN}$, and a source contact (S) coupled to the gate contact (G) of both the second bypass transistor $Q_{BP2}$ and the reverse diode connected transistor $Q_{RD}$.

The feedback stage 18 includes a feedback resistor $R_{FB}$ and a stack of feedback diodes $D_{FB}$. The feedback resistor $R_{FB}$ is coupled between the gate contact (G) of the second transistor $Q_2$ and the gate contact (G) of the third transistor $Q_3$. The stack of feedback diodes $D_{FB}$ are coupled between the regulated output voltage node $N_{VREG}$ and the gate contact (G) of the second transistor $Q_2$. Each one of the feedback diodes $D_{FB}$ in the stack of feedback diodes may be a transistor comprising a gate contact (G) corresponding to an anode of the device, and a source contact (S) coupled to a drain contact (D) corresponding to a cathode of the device. While only two feedback diodes $D_{FB}$ are shown, any number of feedback diodes $D_{FB}$ may be included in the stack of feedback diodes $D_{FB}$.

The first transistor $Q_1$, the second transistor $Q_2$, and the third transistor Q3 may be pseudomorphic high electron mobility transistors (pHEMTs) in some embodiments. Specifically, the first transistor $Q_1$ and the third transistor $Q_3$ may be depletion mode pHEMTs, and the second transistor $Q_2$ may be an enhancement mode pHEMT. The first bypass transistor $Q_{BP1}$, the second bypass transistor $Q_{BP2}$, and the reverse diode connected transistor $Q_{RD}$ may also be pHEMTs. Specifically, the first bypass transistor $Q_{BP1}$ and the reverse connected diode transistor $Q_{RD}$ may be a depletion mode pHEMT, and the second bypass transistor $Q_{BP2}$ may be an enhancement mode pHEMT. Each one of the feedback diodes $D_{FB}$ may also be pHEMT devices. Specifically, each one of the feedback diodes $D_{FB}$ may be depletion mode pHEMT devices. Those skilled in the art will appreciate that connecting a drain contact (D) and a source contact (S) of a depletion mode pHEMT effectively creates a device that behaves similar to a Schottky diode between a gate contact (G) corresponding to an anode and the connected drain contact (D) and source contact (S) corresponding to a cathode thereof.

As discussed above, the first bypass transistor $Q_{BP1}$ may be a depletion mode pHEMT, while the second bypass transistor $Q_{BP2}$ may be an enhancement mode pHEMT. Accordingly, when no enable signal EN is present at the enable signal node $N_{EN}$, the first bypass transistor $Q_{BP1}$ may be in an on state while the second bypass transistor $Q_{BP2}$ is in an off state. Because the second bypass transistor $Q_{BP2}$ is in an off state, current cannot flow through the gain stage 16, and the voltage regulator circuitry 14 is powered off. When an enable signal EN suitable for maintaining both the first bypass transistor $Q_{BP1}$ and the second bypass transistor $Q_{BP2}$ in an off state is provided to the enable signal node $N_{EN}$, the voltage regulator circuitry 14 is similarly powered off. Maintaining the second bypass transistor $Q_{BP2}$, or the first bypass transistor $Q_{BP1}$ and the second bypass transistor $Q_{BP2}$ in an off state prevents the consumption of current when the device is inactive and thus may prolong battery life of a mobile device in which the voltage regulator circuitry 14 is provided. When an enable signal EN suitable for turning on the first bypass transistor $Q_{BP1}$ and the second bypass transistor $Q_{BP2}$, either partially or completely, is provided to the enable signal node $N_{EN}$, the voltage regulator circuitry 14 is powered on. In some embodiments, the enable signal EN in the active state is equal to the power supply voltage $V_{PS}$, however, any suitable enable signal EN may be provided to power on the voltage regulator circuitry 14 without departing from the principles of the present disclosure. As discussed above, the reverse connected diode transistor $Q_{RD}$ may limit the current flow from the enable signal node $N_{EN}$ to the gate contact (G) of the second bypass transistor $Q_{BP2}$ when the voltage regulator circuitry 14 is powered on.

When the first bypass transistor $Q_{BP1}$ and the second bypass transistor $Q_{BP2}$ are closed, the gain stage 16 is placed between the power supply voltage $V_{PS}$ (or a portion thereof, depending on the amount that the first bypass transistor $Q_{BP1}$ is turned on) and a fixed potential (e.g., ground). The power supply voltage $V_{PS}$ provided at the drain contact (D) of the first transistor $Q_1$ will turn on the device, providing a portion of the supply voltage $V_{PS}$ to the regulated output voltage node $N_{VREG}$. This portion of the power supply voltage $V_{PS}$ will be dropped across the current setting resistor $R_{CS}$ and provided back to the gate contact (G) of the first transistor $Q_1$. This feedback loop effectively makes the first transistor $Q_1$ act as an active load and current source for the second transistor $Q_2$, such that a substantially constant current is provided to the drain contact (D) of the second transistor $Q_2$.

The portion of the power supply voltage $V_{PS}$ provided at the regulated output voltage node $N_{VREG}$ is further dropped across the stacked feedback diodes $D_{FB}$ and provided to the gate contact (G) of the second transistor $Q_2$. Each one of the stacked feedback diodes $D_{FB}$ effectively provides a voltage drop that is dependent on temperature so as to provide a desired relationship of a regulated output voltage $V_{REG}$ present at the regulated output voltage node $N_{VREG}$ to ambient temperature. The voltage across the stacked feedback diodes $D_{FB}$ is fed into the gate contact (G) of the second transistor $Q_2$ to effectively create a feedback loop. Further, the voltage across the stacked feedback diodes $D_{FB}$ is dropped across the feedback resistor $R_{FB}$ and fed into the gate contact (G) of the third transistor $Q_3$, which in turn effectively provides a source degeneration impedance for the second transistor $Q_2$ in order to increase the linearity thereof. The feedback between the source contact (S) and the gate contact (G) of the first transistor $Q_1$, between the regulated output voltage node $N_{VREG}$ and the second transistor $Q_2$, and between the regulated output voltage node $N_{VREG}$ and the third transistor $Q_3$ may reduce the impact of process variation on the regulated output voltage $V_{REG}$ provided from the voltage regulator circuitry 14 and provide a desired relationship between the regulated output voltage $V_{REG}$ and ambient temperature.

Figure 3:
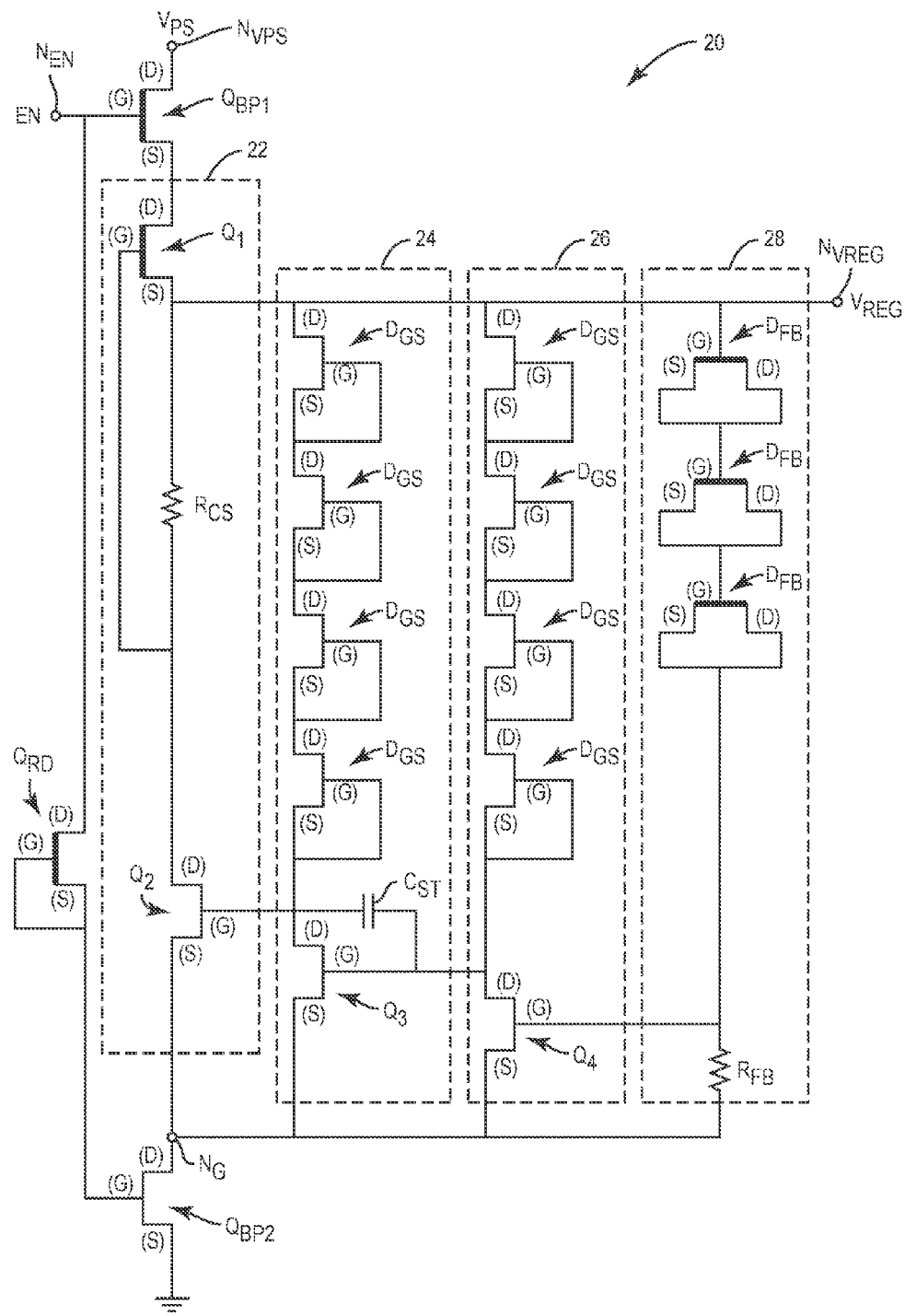
FIG. 3 is a functional schematic illustrating voltage regulator circuitry according to one embodiment of the present disclosure.

Due to the fact that the voltage regulator circuitry 14 is created using a pHEMT process, the size of the circuitry may be minimized. Further, the pHEMT process and circuit topology may provide short turn-on times and low quiescent current consumption. Despite these benefits, the voltage regulator circuitry 14 shown in FIG. 2 may fail to provide an adequate gain response. Accordingly, FIG. 3 shows voltage regulator circuitry 20 according to an additional embodiment of the present disclosure. The voltage regulator circuitry 20 includes a first gain stage 22, a second gain stage 24, a third gain stage 26, and a feedback stage 28.

The first gain stage 22 includes a first transistor $Q_1$, a current setting resistor $R_{CS}$, and a second transistor $Q_2$. The first transistor $Q_1$ includes a gate contact (G), a drain contact (D) coupled to a power supply voltage node $N_{VPS}$, and a source contact (S) coupled to the gate contact (G) via the current setting resistor $R_{CS}$ and coupled to a regulated output voltage node $N_{VREG}$. The second transistor $Q_2$ includes a gate contact (G), a drain contact (D) coupled to the source contact (S) of the first transistor $Q_1$, and a source contact (S) coupled to a ground node $N_G$.

A first bypass transistor $Q_{BP1}$ may be coupled between a power supply voltage $V_{PS}$ and the power supply voltage node $N_{VPS}$. Specifically, a drain contact (D) of the first bypass transistor $Q_{BP1}$ may receive the power supply voltage $V_{PS}$ and a source contact (S) may be coupled to the power supply voltage node $N_{VPS}$. A gate contact (G) of the first bypass transistor $Q_{BP1}$ may be coupled to an enable signal node $N_{EN}$. A second bypass transistor $Q_{BP2}$ may be coupled between the ground node $N_G$ and a fixed potential (e.g., ground). Specifically, a drain contact (D) of the second bypass transistor $Q_{BP2}$ may be coupled to the ground node $N_G$ and a source contact (S) may be coupled to a fixed potential (e.g., ground). A gate contact (G) of the second bypass transistor $Q_{BP2}$ may be coupled to the enable signal node $N_{EN}$ via a reverse connected diode transistor $Q_{RD}$, which is configured to limit the turn-on gate current provided from the enable signal node $N_{EN}$ to the second bypass transistor $Q_{BP2}$. The reverse connected diode transistor $Q_{RD}$ may include a gate contact (G), a drain contact (D) coupled to the enable signal node $N_{EN}$, and a source contact (S) coupled to the gate contact (G) of both the second bypass transistor $Q_{BP2}$ and the reverse connected diode transistor $Q_{RD}$.

The second gain stage 24 includes a first stack of gain stage diodes $D_{GS}$ and a third transistor $Q_3$. The first stack of gain stage diodes $D_{GS}$ are coupled anode-to-cathode between the regulated output voltage node $N_{VREG}$ and the gate contact (G) of the second transistor $Q_2$. The third transistor $Q_3$ includes a gate contact (G), a drain contact (D) coupled to the gate contact (G) of the second transistor $Q_2$, and a source contact (S) coupled to the ground node $N_G$. In some embodiments, a stabilizer capacitor $C_{ST}$ is coupled between the gate contact (G) and the drain contact (D) of the third transistor $Q_3$.

The third gain stage 26 is similar to the second gain stage 24 and includes a second stack of gain stage diodes $D_{GS}$ and a fourth transistor $Q_4$. The second stack of gain stage diodes $D_{GS}$ are coupled anode-to-cathode between the regulated output voltage node $N_{VREG}$ and the gate contact (G) of the third transistor $Q_3$. The fourth transistor $Q_4$ includes a gate contact (G), a drain contact (D) coupled to the gate contact (G) of the third transistor $Q_3$, and a source contact (S) coupled to the ground node $N_G$.

The feedback stage 28 includes a stack of feedback diodes $D_{FB}$ and a feedback resistor $R_{FB}$. The stack of feedback diodes $D_{FB}$ are coupled anode-to-cathode between the regulated output voltage node $N_{VREG}$ and the gate contact (G) of the fourth transistor $Q_4$. The feedback resistor $R_{FB}$ is coupled between the gate contact (G) of the fourth transistor $Q_4$ and the ground node $N_G$.

The first transistor $Q_1$, the second transistor $Q_2$, the third transistor $Q_3$, and the fourth transistor $Q_4$ may be pHEMTs in some embodiments. Specifically, the first transistor may be a depletion mode pHEMT and the second transistor $Q_2$, the third transistor $Q_3$, and the fourth transistor $Q_4$ may be enhancement mode transistors. The first bypass transistor $Q_{BP1}$, the second bypass transistor $Q_{BP2}$, and the reverse connected diode transistor $Q_{RD}$ may also be pHEMTs. Specifically, the first bypass transistor $Q_{BP1}$ and the reverse connected diode transistor $Q_{RD}$ may be depletion mode pHEMTs, and the second bypass transistor $Q_{BP2}$ may be an enhancement mode pHEMT. Each one of the gain stage diodes $D_{GS}$ may also be pHEMT devices. Specifically, each one of the gain stage diodes $D_{GS}$ may be enhancement mode pHEMT devices. Those skilled in the art will appreciate that connecting a drain contact (D) and a gate contact (G) of an enhancement mode pHEMT creates a device that behaves similar to a diode between the connected drain contact (D) and gate contact (G) corresponding to an anode and a source contact (S) corresponding to a cathode thereof.

As discussed above, the first bypass transistor $Q_{BP1}$ may be a depletion mode pHEMT, while the second bypass transistor $Q_{BP2}$ may be an enhancement mode pHEMT. Accordingly, when no enable signal EN is present at the enable signal node $N_{EN}$, the first bypass transistor $Q_{BP1}$ may be in an on state while the second bypass transistor $Q_{BP2}$ is in an off state. Because the second bypass transistor $Q_{BP2}$ is in an off state, current cannot flow through the gain stage 16, and the voltage regulator circuitry 20 is powered off. When an enable signal suitable for maintaining the first bypass transistor $Q_{BP1}$ and the second bypass transistor $Q_{BP2}$ in an off state is provided to the enable signal node $N_{EN}$, the voltage regulator circuitry 20 is similarly powered off. Maintaining the second bypass transistor $Q_{BP2}$, or the first bypass transistor $Q_{BP1}$ and the second bypass transistor $Q_{BP2}$ in an off state prevents the consumption of current when the device is inactive and thus may prolong battery life of a mobile device in which the voltage regulator circuitry 20 is provided. When the voltage regulator circuitry 20 is powered on, an enable signal EN suitable for turning on the first bypass transistor $Q_{BP1}$ and the second bypass transistor $Q_{BP2}$, either partially or completely, is provided to the enable signal node $N_{EN}$. In some embodiments, the enable signal EN is equal to the power supply voltage $V_{PS}$, however, any suitable enable signal EN may be provided to power on the voltage regulator circuitry 20 without departing from the principles of the present disclosure. As discussed above, the reverse connected diode transistor $Q_{RD}$ may limit the current flow from the enable signal node $N_{EN}$ to the gate contact (G) of the second bypass transistor $Q_{BP2}$ when the voltage regulator circuitry 20 is powered on.

When the first bypass transistor $Q_{BP1}$ and the second bypass transistor $Q_{BP2}$ are closed, the first gain stage 22 is placed between the power supply voltage $V_{PS}$ (or a portion thereof, depending on the amount that the first bypass transistor $Q_{BP1}$ is turned on) and a fixed potential (e.g., ground). The power supply voltage $V_{PS}$ provided at the drain contact (D) of the first transistor $Q_1$ will turn on the device, providing a portion of the supply voltage $V_{PS}$ to the regulated output voltage node $N_{VREG}$. This portion of the power supply voltage $V_{PS}$ will be dropped across the current setting resistor $R_{CS}$ and provided back to the gate contact (G) of the first transistor $Q_1$. This feedback loop effectively makes the first transistor $Q_1$ act as an active load and current source for the second transistor $Q_2$, such that a substantially constant current is provided to the drain contact (D) of the second transistor $Q_2$.

The portion of the power supply voltage $V_{PS}$ provided at the regulated output voltage node $N_{VREG}$ is further dropped across the stacked feedback diodes $D_{FB}$ and the feedback resistor $R_{FB}$ and provided to the gate contact (G) of the fourth transistor $Q_4$. Each one of the stacked feedback diodes $D_{FB}$ effectively provides a voltage drop that is dependent on temperature so as to provide a desired relationship of a regulated output voltage $V_{REG}$ present at the regulated output voltage node $N_{VREG}$ to ambient temperature. The voltage across the stacked feedback diodes $D_{FB}$ is fed into the gate contact (G) of the fourth transistor $Q_4$ to effectively create a feedback loop between the regulated output voltage node $N_{VREG}$ and the gate contact (G) of the fourth transistor $Q_4$.

The portion of the power supply voltage $V_{PS}$ provided at the regulated output voltage node $N_{VREG}$ is further dropped across the second set of stacked gain stage diodes $D_{GS}$ and provided to the gate contact (G) of the third transistor $Q_3$. This voltage may change based on the impedance provided by the fourth transistor $Q_4$, which is controlled by the feedback provided by the stacked feedback diodes $D_{FB}$ as discussed above. Accordingly, another feedback loop is provided between the regulated voltage output node $N_{VREG}$ and the gate contact (G) of the third transistor $Q_3$. The first set of stacked gain stage diodes $D_{GS}$ similarly provide a feedback loop between the regulated voltage output node $N_{VREG}$ and the gate contact (G) of the second transistor $Q_2$.

The impedance of each one of the gain stage diodes $D_{GS}$ can be expressed by Equation (2):

$$1/g_m \quad (2)$$

where $g_m$ is the transconductance of the pHEMT. The gain of each one of the second gain stage 24 and the third gain stage 26, which can be simplified as common source amplifiers, can be expressed by Equation (3):

$$G = g_m R_D \quad (3)$$

where $R_D$ is a drain resistance of the gain stage (in the present case, the combined impedance of the gain stage diodes $D_{GS}$), which can be rewritten according to Equation 4:

$$G = g_m \left(4 * \frac{1}{g_m}\right) = 4 \quad (4)$$

which, as illustrated, is independent of any factors that may change due to process variations in the pHEMTs making up the gain stage diodes and the transistors in each one of the gain stages. As discussed above, it is highly desirable to decouple voltage control in a voltage regulator for an RF power amplifier from process variations that may occur in the fabrication thereof. By providing the second gain stage 24 and the third gain stage 26 such that the gain thereof is independent of process variations that may occur therein, the gain of the voltage regulator circuitry 20 may be increased significantly without sacrificing voltage control due to process variation.

Due to the fact that the voltage regulator circuitry 20 is created using a pHEMT process, the size of the circuitry may be minimized. Further, the pHEMT process and circuit topology may provide short turn-on times and low quiescent current consumption. Notably, while three gain stages are shown in the voltage regulator circuitry 20, any number of gain stages may be provided without departing from the principles of the present disclosure. In one embodiment, the third gain stage may be removed such that only the first gain stage 22 and the second gain stage 24 are provided, and the feedback stage 28 is coupled directly to the second gain stage 24 (e.g., by coupling the stacked feedback diodes $D_{FB}$ between the regulated output voltage node $N_{VREG}$ and the gate contact (G) of the third transistor $Q_3$ and by coupling the feedback resistor $R_{FB}$ between the gate contact (G) of the third transistor $Q_3$ and the ground node $N_G$). In another embodiment, at least a fourth gain stage is added between the third gain stage 26 and the feedback stage 28. While a particular number of gain stage diodes $D_{GS}$ and feedback diodes $D_{FB}$ are shown in FIG. 3, any number of gain stage diodes $D_{GS}$ and any number of feedback diodes $D_{FB}$ may be provided without departing from the principles of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Voltage regulator circuitry comprising:
    a first gain stage comprising:
        a first transistor comprising a gate contact, a drain contact coupled to a supply voltage node, and a source contact coupled to a regulated output voltage node and to the gate contact via a current setting resistor; and
        a second transistor comprising a gate contact, a drain contact coupled to the gate contact of the first transistor, and a source contact coupled to a ground node;
    a second gain stage comprising:
        a third transistor comprising a gate contact, a drain contact coupled to the gate contact of the second transistor, and a source contact coupled to the ground node; and
        a plurality of stacked gain stage diodes coupled in series between the regulated output voltage node and the drain contact of the third transistor such that an anode of a first one of the plurality of stacked gain stage diodes is coupled to the regulated output voltage node and a cathode of a last one of the plurality of stacked gain stage diodes is coupled to the drain contact of the third transistor; and
    a feedback stage comprising:
        a feedback resistor coupled between the gate contact of the third transistor and the ground node; and
        a plurality of stacked feedback diodes coupled between the regulated output voltage node and the feedback resistor such that an anode of a first one of the plurality of stacked feedback diodes is coupled to the regulated output voltage node and a cathode of a last one of the plurality of stacked feedback diodes is coupled to the feedback resistor.

2. The voltage regulator circuitry of claim 1 wherein:
    the first transistor is a depletion mode pseudomorphic high electron mobility transistor (pHEMT);
    the second transistor and the third transistor are enhancement mode pHEMTs;
    each one of the plurality of stacked gain stage diodes is an enhancement mode pHEMT comprising a gate contact, a source contact coupled to the gate contact, and a drain contact, wherein the drain contact corresponds to an anode and the connected gate contact and source contact correspond to a cathode; and
    each one of the plurality of stacked feedback diodes is a depletion mode pHEMT comprising a gate contact, a drain contact, and a source contact coupled to the drain contact, wherein the gate contact corresponds to an anode and the connected source contact and drain contact correspond to a cathode.

3. The voltage regulator circuitry of claim 2 further comprising:
    a first bypass transistor comprising a gate contact coupled to an enable signal node, a drain contact coupled to a power supply voltage, and a source contact coupled to the supply voltage node; and
    a second bypass transistor comprising a gate contact coupled to the enable signal node, a drain contact coupled to the ground node, and a source contact coupled to a fixed potential.

4. The voltage regulator circuitry of claim 3 wherein:
    the first bypass transistor is a depletion mode pHEMT; and
    the second bypass transistor is an enhancement mode pHEMT.

5. The voltage regulator circuitry of claim 1 further comprising:
    a first bypass transistor comprising a gate contact coupled to an enable signal node, a drain contact coupled to a power supply voltage, and a source contact coupled to the supply voltage node; and
    a second bypass transistor comprising a gate contact coupled to the enable signal node, a drain contact coupled to the ground node, and a source contact coupled to a fixed potential.

6. The voltage regulator circuitry of claim 5 wherein:
the first bypass transistor is a depletion mode pHEMT; and
the second bypass transistor is an enhancement mode pHEMT.

7. The voltage regulator circuitry of claim 1 wherein a gain of the voltage regulator is independent of a pinchoff voltage and a transconductance of the first transistor, the second transistor, and the third transistor.

8. Voltage regulator circuitry comprising:
a first gain stage comprising:
a first transistor comprising a gate contact, a drain contact coupled to a supply voltage node, and a source contact coupled to a regulated output voltage node and to the gate contact via a current setting resistor; and
a second transistor comprising a gate contact, a drain contact coupled to the gate contact of the first transistor, and a source contact coupled to a ground node;
a second gain stage comprising:
a third transistor comprising a gate contact, a drain contact coupled to the gate contact of the second transistor, and a source contact coupled to the ground node; and
a first plurality of stacked gain stage diodes coupled in series between the regulated output voltage node and the drain contact of the third transistor such that an anode of a first one of the first plurality of stacked gain stage diodes is coupled to the regulated output voltage node and a cathode of a last one of the first plurality of stacked gain stage diodes is coupled to the drain contact of the third transistor;
a third gain stage comprising:
a fourth transistor comprising a gate contact, a drain contact coupled to the gate contact of the third transistor, and a source contact coupled to the ground node; and
a second plurality of stacked gain stage diodes coupled in series between the regulated output voltage node and the drain contact of the fourth transistor such that an anode of a first one of the second plurality of stacked gain stage diodes is coupled to the regulated output voltage node and a cathode of a last one of the second plurality of stacked gain stage diodes is coupled to the drain contact of the fourth transistor; and
a feedback stage comprising:
a feedback resistor coupled between the gate contact of the fourth transistor and the ground node; and
a plurality of stacked feedback diodes coupled between the regulated output voltage node and the feedback resistor such that an anode of a first one of the plurality of stacked feedback diodes is coupled to the regulated output voltage node and a cathode of a last one of the plurality of stacked feedback diodes is coupled to the feedback resistor.

9. The voltage regulator circuitry of claim 8 wherein:
the first transistor is a depletion mode pseudomorphic high electron mobility transistor (pHEMT);
the second transistor, the third transistor, and the fourth transistor are enhancement mode pHEMTs;
each one of the first plurality of stacked gain stage diodes and the second plurality of stacked gain stage diodes is an enhancement mode pHEMT comprising a gate contact, a source contact coupled to the gate contact, and a drain contact, wherein the drain contact corresponds to an anode and the connected gate contact and drain contact correspond to a cathode; and
each one of the plurality of stacked feedback diodes is a depletion mode pHEMT comprising a gate contact, a drain contact, and a source contact coupled to the drain contact, wherein the gate contact corresponds to an anode and the connected source contact and drain contact correspond to a cathode.

10. The voltage regulator circuitry of claim 9 further comprising:
a first bypass transistor comprising a gate contact coupled to an enable signal node, a drain contact coupled to a power supply voltage, and a source contact coupled to the supply voltage node; and
a second bypass transistor comprising a gate contact coupled to the enable signal node, a drain contact coupled to the ground node, and a source contact coupled to a fixed potential.

11. The voltage regulator circuitry of claim 10 wherein:
the first bypass transistor is a depletion mode pHEMT; and
the second bypass transistor is an enhancement mode pHEMT.

12. The voltage regulator circuitry of claim 11 further comprising a stabilizer capacitor coupled between the drain contact of the third transistor and the gate contact of the third transistor.

13. The voltage regulator circuitry of claim 10 further comprising a stabilizer capacitor coupled between the drain contact of the third transistor and the gate contact of the third transistor.

14. The voltage regulator circuitry of claim 8 further comprising:
a first bypass transistor comprising a gate contact coupled to an enable signal node, a drain contact coupled to a power supply voltage, and a source contact coupled to the supply voltage node; and
a second bypass transistor comprising a gate contact coupled to the enable signal node, a drain contact coupled to the ground node, and a source contact coupled to a fixed potential.

15. The voltage regulator circuitry of claim 14 wherein:
the first bypass transistor is a depletion mode pHEMT; and
the second bypass transistor is an enhancement mode pHEMT.

16. The voltage regulator circuitry of claim 15 further comprising a stabilizer capacitor coupled between the drain contact of the third transistor and the gate contact of the third transistor.

17. The voltage regulator circuitry of claim 14 further comprising a stabilizer capacitor coupled between the drain contact of the third transistor and the gate contact of the third transistor.

18. The voltage regulator circuitry of claim 8 further comprising a stabilizer capacitor coupled between the drain contact of the third transistor and the gate contact of the third transistor.

19. The voltage regulator circuitry of claim 18 wherein a gain of the voltage regulator is independent of a pinchoff voltage and a transconductance of the first transistor, the second transistor, the third transistor, and the fourth transistor.

20. The voltage regulator circuitry of claim 8 wherein a gain of the voltage regulator is independent of a pinchoff voltage and a transconductance of the first transistor, the second transistor, the third transistor, and the fourth transistor.

* * * * *